(12) United States Patent
Wootton et al.

(10) Patent No.: US 10,531,230 B2
(45) Date of Patent: Jan. 7, 2020

(54) BLOCKCHAIN SYSTEMS AND METHODS FOR CONFIRMING PRESENCE

(71) Applicant: Ivani, LLC, Dardenne Prairie, MO (US)

(72) Inventors: Matthew Wootton, O'Fallon, MO (US); Boris Dieseldorff, St. Charles, MO (US); Justin McKinney, Wildwood, MO (US)

(73) Assignee: Ivani, LLC, Dardenne Prairie, MO (US)

( * ) Notice: Subject to any disclaimer, the term of this patent is extended or adjusted under 35 U.S.C. 154(b) by 0 days.

(21) Appl. No.: 16/234,098

(22) Filed: Dec. 27, 2018

(65) Prior Publication Data

US 2019/0166459 A1    May 30, 2019

Related U.S. Application Data

(63) Continuation-in-part of application No. 15/674,487, filed on Aug. 10, 2017, which is a continuation of
(Continued)

(51) Int. Cl.
*H04W 24/00* (2009.01)
*H04W 4/02* (2018.01)
(Continued)

(52) U.S. Cl.
CPC .............. *H04W 4/023* (2013.01); *G01V 3/12* (2013.01); *G11C 11/2257* (2013.01);
(Continued)

(58) Field of Classification Search
CPC .............................. H04W 4/029; H04W 64/00
See application file for complete search history.

(56) References Cited

U.S. PATENT DOCUMENTS

| | | |
|---|---|---|
| 4,054,879 A | 10/1977 | Wright et al. |
| 4,649,388 A | 3/1987 | Atlas |

(Continued)

FOREIGN PATENT DOCUMENTS

| | | |
|---|---|---|
| CA | 2834522 A1 | 5/2014 |
| CA | 2945702 A1 | 8/2015 |

(Continued)

OTHER PUBLICATIONS

International Search Report, International Patent Application No. PCT/US2015/013127, dated Apr. 24, 2015 (10 pages).
(Continued)

*Primary Examiner* — Shantell L Heiber
(74) *Attorney, Agent, or Firm* — Lewis Rice LLC

(57) ABSTRACT

Systems and methods for confirming the presence of a person or asset for a given purpose, and recording this information in a distributed ledger. The distributed ledger records and confirms presence indicia in connection with a transaction said facilitates remote and/or automated signatures. The systems and methods detect the presence of one or more humans and/or computing devices at a specific location at the time of a transaction, and contemporaneously recording information concerning the transaction in a distributed ledger. Presence can be determined using network presence sensing (NPS), other types of sensors, or the combination of NPS with other sensors.

29 Claims, 8 Drawing Sheets

Related U.S. Application Data application No. 15/674,328, filed on Aug. 10, 2017, which is a continuation-in-part of application No. 15/600,380, filed on May 19, 2017, now Pat. No. 10,064,013, which is a continuation of application No. 15/227,717, filed on Aug. 3, 2016, now Pat. No. 9,693,195, which is a continuation of application No. 15/084,002, filed on Mar. 29, 2016, now Pat. No. 9,474,042.

(60) Provisional application No. 62/252,954, filed on Nov. 9, 2015, provisional application No. 62/219,457, filed on Sep. 16, 2015, provisional application No. 62/252,954, filed on Nov. 9, 2015, provisional application No. 62/219,457, filed on Sep. 16, 2015.

(51) Int. Cl.

| | |
|---|---|
| *H04W 4/80* | (2018.01) |
| *H04W 64/00* | (2009.01) |
| *H04L 1/00* | (2006.01) |
| *H04L 5/00* | (2006.01) |
| *H04B 17/27* | (2015.01) |
| *G11C 11/22* | (2006.01) |
| *H04B 17/318* | (2015.01) |
| *H04W 4/33* | (2018.01) |
| *H04W 4/30* | (2018.01) |
| *G01V 3/12* | (2006.01) |
| *H04B 17/373* | (2015.01) |
| *G01V 1/00* | (2006.01) |

(52) U.S. Cl.
CPC ...... *G11C 11/2259* (2013.01); *G11C 11/2273* (2013.01); *G11C 11/2293* (2013.01); *G11C 11/2297* (2013.01); *H04B 17/27* (2015.01); *H04B 17/318* (2015.01); *H04B 17/373* (2015.01); *H04L 1/0018* (2013.01); *H04L 5/006* (2013.01); *H04W 4/30* (2018.02); *H04W 4/33* (2018.02); *H04W 4/80* (2018.02); *H04W 64/00* (2013.01); *G01V 1/001* (2013.01); *G11C 11/221* (2013.01)

(56) References Cited

U.S. PATENT DOCUMENTS

| | | | |
|---|---|---|---|
| 4,740,045 | A | 4/1988 | Goodson et al. |
| 5,270,720 | A | 12/1993 | Stove |
| 5,563,455 | A | 10/1996 | Cheng |
| 5,696,514 | A | 12/1997 | Nathanson et al. |
| 6,075,797 | A | 6/2000 | Thomas |
| 6,493,380 | B1 | 12/2002 | Wu et al. |
| 6,524,628 | B1 | 2/2003 | Wai et al. |
| 6,539,483 | B1 | 3/2003 | Harrison et al. |
| 6,573,861 | B1 | 6/2003 | Hommel et al. |
| 6,693,536 | B2 | 2/2004 | Bauer, Jr. et al. |
| 7,047,015 | B2 | 5/2006 | Hawe |
| 7,295,109 | B2 | 11/2007 | Kobayashi |
| 7,317,419 | B2 | 1/2008 | Sugar et al. |
| 7,423,576 | B2 | 9/2008 | Sahinoglu et al. |
| 7,652,617 | B2 | 1/2010 | Kurtz et al. |
| 7,663,325 | B2 | 2/2010 | McDonough et al. |
| 7,733,220 | B2 | 6/2010 | Libby |
| 8,138,918 | B2 | 3/2012 | Habib et al. |
| 8,271,386 | B2 | 9/2012 | Dea et al. |
| 8,354,925 | B1 | 1/2013 | Libby et al. |
| 8,402,543 | B1 | 3/2013 | Ranjan et al. |
| 8,456,304 | B2 | 6/2013 | van Doorn et al. |
| 8,502,666 | B1 | 8/2013 | Tam et al. |
| 8,531,134 | B2 | 9/2013 | Chemel et al. |
| 8,536,998 | B1 | 9/2013 | Siu et al. |
| 8,552,664 | B2 | 10/2013 | Chemel et al. |
| 8,555,388 | B1 | 10/2013 | Wang et al. |
| 8,593,264 | B2 | 11/2013 | Umezawa et al. |
| 8,624,734 | B2 | 1/2014 | Inomata et al. |
| 8,682,812 | B1 | 3/2014 | Ranjan |
| 8,762,298 | B1 | 6/2014 | Ranjan et al. |
| 8,766,556 | B2 | 7/2014 | Meyer |
| 8,788,448 | B2 | 7/2014 | Fadell et al. |
| 8,793,790 | B2 | 7/2014 | Khurana et al. |
| 8,818,288 | B2 | 8/2014 | Patwari et al. |
| 8,836,344 | B2 | 9/2014 | Habib et al. |
| 8,842,010 | B2 | 9/2014 | Cehelnik |
| 8,844,038 | B2 | 9/2014 | Niemela |
| 8,849,471 | B2 | 9/2014 | Daniel et al. |
| 8,984,581 | B2 | 3/2015 | Luna et al. |
| 9,143,413 | B1 | 9/2015 | Manku et al. |
| 9,143,968 | B1 | 9/2015 | Manku et al. |
| 9,144,041 | B2 | 9/2015 | Curtis et al. |
| 9,185,121 | B2 | 11/2015 | Chari et al. |
| 9,245,426 | B2 | 1/2016 | Caicedo Fernandez et al. |
| 9,369,476 | B2 | 6/2016 | Chekina et al. |
| 9,378,361 | B1 | 6/2016 | Yen et al. |
| 9,407,663 | B2 | 8/2016 | Pauley, Jr. et al. |
| 9,413,839 | B2 | 8/2016 | Annan et al. |
| 9,523,760 | B1 | 12/2016 | Kravets et al. |
| 9,584,974 | B1 | 2/2017 | Omer et al. |
| 9,743,294 | B1 | 8/2017 | Omer et al. |
| 9,900,794 | B2 | 2/2018 | Han et al. |
| 2003/0108119 | A1 | 6/2003 | Mohebbi et al. |
| 2004/0080415 | A1 | 4/2004 | Sorensen |
| 2004/0196140 | A1 | 10/2004 | Sid |
| 2005/0055568 | A1 | 3/2005 | Agrawala et al. |
| 2005/0083199 | A1 | 4/2005 | Hall et al. |
| 2006/0037077 | A1 | 2/2006 | Gadde et al. |
| 2006/0217132 | A1 | 9/2006 | Drummond-Murray et al. |
| 2007/0225000 | A1 | 9/2007 | Cleveland |
| 2007/0283002 | A1 | 12/2007 | Bornhoevd et al. |
| 2008/0033878 | A1* | 2/2008 | Krikorian ............ G06Q 20/02 705/44 |
| 2008/0119130 | A1 | 5/2008 | Sinha |
| 2008/0148398 | A1 | 6/2008 | Mezack et al. |
| 2008/0240008 | A1 | 10/2008 | Backes et al. |
| 2008/0303655 | A1 | 12/2008 | Johnson |
| 2009/0031006 | A1* | 1/2009 | Johnson ............... G06F 16/972 709/218 |
| 2009/0040952 | A1 | 2/2009 | Cover et al. |
| 2009/0062696 | A1 | 3/2009 | Nathan et al. |
| 2009/0184804 | A1 | 7/2009 | Seppa |
| 2009/0256483 | A1 | 10/2009 | Gehman et al. |
| 2010/0125897 | A1 | 5/2010 | Jain et al. |
| 2010/0145545 | A1 | 6/2010 | Mosebrook et al. |
| 2010/0315284 | A1 | 12/2010 | Trizna |
| 2010/0328492 | A1* | 12/2010 | Fedorovskaya ...... G06K 9/4671 348/231.2 |
| 2011/0130092 | A1 | 6/2011 | Yun et al. |
| 2011/0141647 | A1 | 6/2011 | Garcia et al. |
| 2011/0153811 | A1 | 6/2011 | Jeong et al. |
| 2011/0211563 | A1 | 9/2011 | Herrala et al. |
| 2011/0309931 | A1 | 12/2011 | Rose |
| 2012/0009882 | A1 | 1/2012 | Patwari et al. |
| 2012/0046003 | A1 | 2/2012 | Ying |
| 2012/0092060 | A1 | 4/2012 | Ganesan |
| 2012/0115512 | A1 | 5/2012 | Grainger et al. |
| 2012/0146788 | A1 | 6/2012 | Wilson et al. |
| 2012/0181865 | A1 | 7/2012 | Muthu |
| 2012/0184296 | A1 | 7/2012 | Milosiu et al. |
| 2012/0207481 | A1 | 8/2012 | Elberbaum |
| 2012/0207484 | A1 | 8/2012 | Hunt |
| 2013/0090151 | A1 | 4/2013 | Ngai et al. |
| 2013/0162459 | A1 | 6/2013 | Aharony et al. |
| 2013/0175863 | A1 | 7/2013 | Pan |
| 2013/0260602 | A1 | 10/2013 | German et al. |
| 2013/0283256 | A1 | 10/2013 | Proud |
| 2014/0004874 | A1 | 1/2014 | Schwartz et al. |
| 2014/0015706 | A1 | 1/2014 | Ishihara et al. |
| 2014/0128778 | A1 | 5/2014 | Chan et al. |
| 2014/0135042 | A1 | 5/2014 | Buchheim et al. |
| 2014/0140231 | A1 | 5/2014 | Haiut et al. |
| 2014/0165207 | A1 | 6/2014 | Engel et al. |
| 2014/0247179 | A1 | 9/2014 | Furuskog et al. |
| 2014/0286380 | A1 | 9/2014 | Prager et al. |

(56) References Cited

U.S. PATENT DOCUMENTS

| | | | |
|---|---|---|---|
| 2014/0330960 | A1 | 11/2014 | Haga et al. |
| 2015/0005900 | A1 | 1/2015 | Steele et al. |
| 2015/0022123 | A1 | 1/2015 | Van De Sluis et al. |
| 2015/0043377 | A1 | 2/2015 | Cholas et al. |
| 2015/0049745 | A1 | 2/2015 | Han et al. |
| 2015/0049792 | A1 | 2/2015 | Han et al. |
| 2015/0059248 | A1 | 3/2015 | Iwata et al. |
| 2015/0069242 | A1* | 3/2015 | Alameh ............... G01J 1/0407 250/338.3 |
| 2015/0078295 | A1 | 3/2015 | Mandyam et al. |
| 2015/0084522 | A1* | 3/2015 | Yamamoto ......... H05B 37/0227 315/154 |
| 2015/0098377 | A1 | 4/2015 | Amini et al. |
| 2015/0143454 | A1 | 5/2015 | Lee et al. |
| 2015/0186855 | A1* | 7/2015 | Bennett ............... G06Q 20/102 705/40 |
| 2015/0187192 | A1* | 7/2015 | Tabe .................... H04N 21/814 340/541 |
| 2015/0195100 | A1 | 7/2015 | Imes et al. |
| 2015/0212205 | A1 | 7/2015 | Shpater |
| 2015/0236848 | A1 | 8/2015 | Ma et al. |
| 2015/0245164 | A1 | 8/2015 | Merrill |
| 2015/0257167 | A1 | 9/2015 | Chen et al. |
| 2015/0295808 | A1 | 10/2015 | O'Malley et al. |
| 2015/0301173 | A1 | 10/2015 | Vangeel et al. |
| 2015/0338507 | A1 | 11/2015 | Oh et al. |
| 2016/0028763 | A1 | 1/2016 | Cruz Mota et al. |
| 2016/0050182 | A1 | 2/2016 | Edross |
| 2016/0050224 | A1 | 2/2016 | Ricafort et al. |
| 2016/0183059 | A1 | 6/2016 | Nagy et al. |
| 2016/0187475 | A1 | 6/2016 | Horng et al. |
| 2016/0210838 | A1 | 7/2016 | Yan et al. |
| 2016/0234167 | A1 | 8/2016 | Engel et al. |
| 2016/0241999 | A1 | 8/2016 | Chin et al. |
| 2016/0301543 | A1 | 10/2016 | Minezawa et al. |
| 2016/0335861 | A1 | 11/2016 | Shimura |
| 2017/0146656 | A1 | 5/2017 | Belsley et al. |
| 2017/0343658 | A1 | 11/2017 | Ramirez et al. |
| 2018/0026481 | A1 | 1/2018 | Ku et al. |
| 2018/0131554 | A1 | 5/2018 | Liu et al. |

FOREIGN PATENT DOCUMENTS

| | | |
|---|---|---|
| CN | 101184353 A | 5/2008 |
| CN | 201319687 Y | 9/2009 |
| CN | 201467534 U | 5/2010 |
| CN | 201639825 U | 11/2010 |
| CN | 201839492 U | 5/2011 |
| CN | 102131327 A | 7/2011 |
| CN | 202475882 U | 10/2012 |
| CN | 202738203 U | 2/2013 |
| CN | 202759621 U | 2/2013 |
| CN | 203241317 U | 10/2013 |
| CN | 203243557 U | 10/2013 |
| CN | 203251317 U | 10/2013 |
| EP | 1829003 B1 | 11/2013 |
| JP | 2005136532 A | 5/2005 |
| JP | 2005535950 A | 11/2005 |
| JP | 2006129098 A | 5/2006 |
| JP | 2007159370 A | 6/2007 |
| JP | 2008305800 A | 12/2008 |
| JP | 2009229318 A | 10/2009 |
| JP | 2011109784 A | 6/2011 |
| JP | 2012190161 A | 10/2012 |
| JP | 2015052475 A | 3/2015 |
| JP | 2015527573 A | 9/2015 |
| JP | 2015222173 A | 12/2015 |
| JP | 2016206851 A | 12/2016 |
| KR | 100887425 B1 | 3/2009 |
| KR | 100912039 B1 | 8/2009 |
| KR | 20090113941 A | 11/2009 |
| KR | 101009613 B1 | 1/2011 |
| KR | 20130012996 A | 2/2013 |
| KR | 20130017298 A | 2/2013 |
| KR | 20140080755 A | 7/2014 |
| KR | 20140120748 A | 10/2014 |
| WO | 2011062445 A2 | 5/2011 |
| WO | 2012010170 A1 | 1/2012 |
| WO | 2014021547 A1 | 2/2014 |
| WO | 2014026226 A1 | 2/2014 |
| WO | 2014109486 A1 | 7/2014 |
| WO | 2014201574 A1 | 12/2014 |
| WO | 2015035830 A1 | 3/2015 |
| WO | 2015168700 A1 | 11/2015 |
| WO | 2017078811 A2 | 5/2017 |

OTHER PUBLICATIONS

International Search Report, International Patent Application No. PCT/US2015/058019, dated Feb. 5, 2016 (10 pages).

International Search Report, International Patent Application No. PCT/US2015/057869, dated Feb. 5, 2016 (10 pages).

International Search Report, International Patent Application No. PCT/US2016/016836, dated May 24, 2016 (12 pages).

International Search Report, International Patent Application No. PCT/US2016/045611, dated May 16, 2017, (10 pages).

International Search Report, International Patent Application No. PCT/US2018/047555, dated Nov. 13, 2018 (10 pages).

International Search Report, International Patent Application No. PCT/US2018/045835, dated Nov. 20, 2018 (21 pages).

Youssef, Moustafa, et al., "Challenges: Device-free Passive Localization for Wireless Environments", Mobicom 2007 Proceedings of the 13th Annual ACM International Conference on Mobile Computing and Networking, held on Sep. 9-14, 2007, in Montreal, Quebec, Canada, pp. 222-229 (8 pages).

NETGEAR®, "N600 WiFi Cable Modem Router, Model C3700 User Manual", dated Mar. 2014 (101 pages).

Openwrt, "Wireless Configuration", https://web.archive.org/web/20140402033233/http://wiki.openwrt.org/doc/uci/wireless (capture of URL http://wiki.openwrf.org/do/uci/wireless on Apr. 2, 2014), printed on Jan. 25, 2018 (10 pages).

Japan Radio Co., Ltd; "26GHz FWA—Technology"; http://www.jrc.co.jp/eng/product/lineup/26ghz_wireless_ip_access_system/tech.html, printed on Jan. 25, 2018 (3 pages).

Apple Insider; "Intel to reportedly supply LTE chips for 2016 iPhone"; http://appleinsider.com/articles/15/03/11/intel-to-reportedly-supply-lte-chips-for-2016-iphone, printed on Jan. 25, 2018 (9 pages).

Ceva; Ceva's DSP Cores Power the World's Leading Mobile Broadband and M2M Applications; http://www.ceva-dsp.com/Mobile-Broadband; May 15, 2016, printed on Jan. 28, 2018 (3 pages).

Adib, Fadel et al., "See Through Walls with Wi-Fi?", ACM SIGCOMM Computer Communication Review, Oct. 2013, vol. 43, Issue 4, pp. 75-86 (12 pages).

quora.com; "What is the function of the baseband processor in wireless devices?"; https://www.quora.com/What-is-the-function-of-the-baseband-processor-in-wireless-devices; May 15, 2016, printed on Jan. 25, 2018 (2 pages).

Wikipedia; "Baseband processor", rhttps://en.wikipedia.org/wiki/Bandband_processor; 2 pages; version dated Apr. 19, 2016, printed on Jan. 25, 2018 (1 page).

LeMahieu, Colin, "Nano: A Feeless Distributed Cryptocurrency Network," https://nano.org/en/whitepaper (8 pages).

Baird, Leemon, "The Swirlds Hashgraph Consensus Algorithm: Fair, Fast, Byzantine Fault Tolerance," Swirlds Tech Report SWIRLDS-TR-2016-1, May 31, 2016, Revised Mar. 18, 2018, https://www.swirlds.com/downloads/SWIRLDS-TR-2016-01.pdf (28 pages).

Popov, Serguei, "The Tangle," Oct. 1, 2017, version 1.3, http://untangled.world/wp-content/uploads/2017/09/iota1_3.pdf (28 pages).

* cited by examiner

BLOCKCHAIN SYSTEMS AND METHODS FOR CONFIRMING PRESENCE

CROSS REFERENCES TO RELATED APPLICATIONS

This application is a Continuation-in-Part of U.S. Utility patent application Ser. No. 15/674,487 filed Aug. 10, 2017, which is a Continuation of U.S. Utility patent application Ser. No. 15/674,328, filed Aug. 10, 2017, which is a Continuation-In Part of U.S. Utility patent application Ser. No. 15/600,380, filed May 19, 2017 and now U.S. Pat. No. 10,064,013, which is a Continuation of U.S. Utility patent application Ser. No. 15/227,717, filed Aug. 3, 2016 and now U.S. Pat. No. 9,693,195, which is a Continuation of U.S. Utility patent application Ser. No. 15/084,002, filed Mar. 29, 2016 and now U.S. Pat. No. 9,474,042, which claims the benefit of U.S. Provisional Patent Application Ser. No. 62/252,954, filed Nov. 9, 2015, and U.S. Provisional Patent Application Ser. No. 62/219,457, filed Sep. 16, 2015. U.S. Utility patent application Ser. No. 15/227,717 also claims the benefit of U.S. Provisional Patent Application Ser. No. 62/252,954, and U.S. Provisional Patent Application Ser. No. 62/219,457. The entire disclosure of all the foregoing is expressly incorporated herein by reference.

BACKGROUND OF THE INVENTION

Field of the Invention

This disclosure is related to the field of distributed ledger technologies. In particular, it relates to the use of distributed ledgers, such as on a blockchain, in conjunction with network presence sensing technologies.

Description of the Related Art

In our busy lives, we often need to be in two places at once. This is a necessary by-product of the concept of business hours. People often require the cooperation of others to complete their jobs, but not everybody is available at the same time, because we are at our own jobs, which we in turn require the cooperation of others to perform. For example, a carrier delivering a package to a residence requires a signature by the recipient to accept delivery. However, suppose the recipient is an accountant who is not at home, but is instead at an office, in turn placing phone calls to the delivery carrier to get a signature on a tax filing. Each person requires the assistance and cooperation of others, but neither can be reached.

While technologies are emerging that can assist with some of these problems, such as electronic signatures that can be provided remotely, there remains the problem of proof. For most routine transactions throughout a day, there is not enough at stake to justify the cost and expense of creating a complete evidentiary record of what took place. For example, suppose the delivery driver approaches the house to deliver the package, rings the doorbell, nobody answers, and so the driver deposits the package, and updates a corresponding database entry in the carrier's parcel tracking software to mark the parcel as delivered, noting the date and time. However, when the homeowner returns after work, the package is gone.

The homeowner reports the absent package to the carrier, who then must make a decision about whether to accept responsibility. Did the homeowner find the package but lie? Did the carrier not actually complete delivery? Was the package stolen? A busy delivery service with thousands of deliveries to make each day does not know in advance which deliveries will lead to a dispute, and thus has little choice but to either exhaustively document all deliveries, or none. Documenting none leaves open the possibility of mistake or fraud, whereas documenting all wastes time and resources creating records that, in most cases, will never be needed. Moreover, later disputes that could be resolved with reference to such records are almost certainly more affordably resolved through compensation to the aggrieved recipient, rather than a prolonged dispute, because the value of what is being delivered rarely merits prolonged negotiation.

These issues are not limited to delivering packages. Other transactions, such as performing services, are equally susceptible of confusion, misunderstanding, mistake, or outright fraud. This is particularly true in emerging sharing economies, in which services are not provided by a known and trusted entity, such as the same lawn mowing service you have been using for a decade, but rather by a stranger. For example, in the ridesharing economy, the specific driver who will provide the ride is essentially a random person the rider most likely has never met before. The rider thus has no existing relationship or basis of trust with that specific individual. Due again to the large volume of small transactions that take place, it is generally not worth the time or expense to exhaustively document the circumstances of any given transaction in these shared economies. This can again lead to mistake, fraud, and abuse. Moreover, even if such records were created, they can be forged. The delivery person, for example, may simply forge a record saying that a package was delivered, whether or not it actually was.

What is needed in the art is a more automated manner of generating information and evidence concerning the facts and circumstances of various transactions, independent of the exercise of discretion or judgment of the parties to that transaction. In particular, this type of supporting data would be useful to have if it could be generated automatically and with minimal effort, in a manner that is tamper-resistant and unfalsifiable, and regardless of whether all parties to a transaction are physically present at the same time or place.

DESCRIPTION OF THE PREFERRED EMBODIMENT(S)

Figure 1:
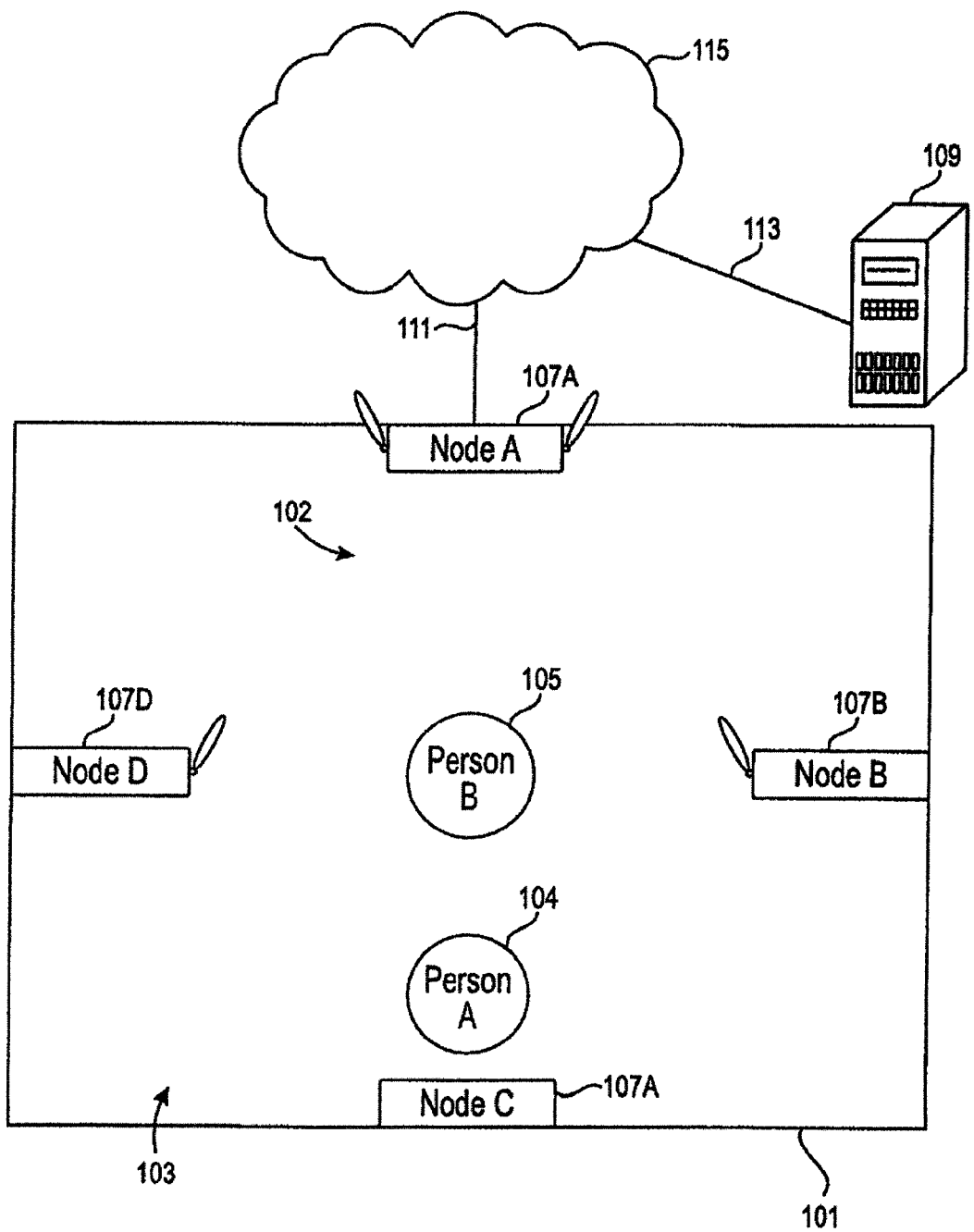
FIG. 1 is a schematic diagram of an embodiment of a prior art system for network presence sensing.

The following detailed description and disclosure illustrates by way of example and not by way of limitation. This description will clearly enable one skilled in the art to make and use the disclosed systems and methods, and describes several embodiments, adaptations, variations, alternatives and uses of the disclosed systems and methods. As various changes could be made in the above constructions without departing from the scope of the disclosures, it is intended that all matter contained in the description or shown in the accompanying drawings shall be interpreted as illustrative, not limiting.

Generally speaking, described herein, are systems and methods for confirming the presence of a person or asset for a given purpose, and recording this information in a distributed ledger. Use of a distributed ledger to record and confirm presence indicia in connection with a transaction also facilitates remote and/or automated signatures.

Market forces are driving significant resources towards the adoption of distributed ledger technologies, and with particular emphasis on creative use of digital ledger technologies implemented via blockchain. For purposes of this disclosure, "blockchain" and related terms should be understood and interpreted in the context of leading white papers pertaining to the subject matter, including, but not necessarily limited to, *Bitcoin: A Peer to Peer Electronic Cash System* (Satoshi Nakamoto 2008). It will be understood by a person of ordinary skill in the art that the precise vocabulary of distributed ledger technologies is not entirely settled, and although the industry has established a general shared understanding of the meaning of key terms, reasonable variations may exist, particularly from implementation to implementation. For purposes of this disclosure, the following definitions generally apply and should be used and understood in both the context of computing generally, as well as the particular environment of a distributed ledger implementation.

While this disclosure discusses embodiments using blockchain, it will be understood by a person of ordinary skill in the art that the methods described herein are suitable for use via any technology that has the aspects of a distributed ledger used in the disclosure, such as: (a) record unique transactions in a manner such that they cannot be modified by a single party; (b) confirm transactions; (c) make available information about those transactions to the parties involved in the transactions. The implementation described herein may use alternative technologies, such as, but not necessarily limited to, a tangle (see, e.g., *The Tangle* version 1.3 (Sergoei Popov Oct. 1, 2017)), a block lattice (see, e.g., *Nano: A Feeless Distributed Cryptocurrency Network* (Colin LeMahieu)), or a hashgraph (see, e.g., *The SWIRLDS Hasgraph Consensus Algorithm: Fair, Fast, Byzantine Fault Tolerance* (Leemon Baird May 31, 2016)).

As used herein, the term "asset" means anything that can be owned or controlled to produce value.

As used herein, "asymmetric key encryption," also known as "public key encryption," "public key cryptography," and "asymmetric cryptography," means a cryptographic system that uses pairs of mathematically related keys, one public and one private, to authenticate messages. The "private key" is kept secret by the sender of a message or document and is used to encrypt the message or document. The "public key" is shared with the public and can be used to decrypt the message or document.

As used herein, the term "blockchain" means a distributed database system comprising a continuously-growing list of ordered records ("blocks") shared across a network. In a typical embodiment, the blockchain functions as a shared transaction ledger.

As used herein, the term "blockchain network" means the collection of nodes interacting via a particular blockchain protocol and rule set.

As used herein, the term "block" means a record in a continuously-growing list of ordered records that comprise a blockchain. In a typical embodiment, a block comprises a collection of confirmed and validated transactions, plus a nonce.

As used herein, the term "consensus" refers to a computational agreement among nodes in a blockchain network as to the content and order of blocks in the blockchain.

As used herein, the term "computer" describes hardware which generally implements functionality provided by digital computing technology, particularly computing functionality associated with microprocessors. The term "computer" is not intended to be limited to any specific type of computing device, but it is intended to be inclusive of all computational devices including, but not limited to: processing devices, microprocessors, personal computers, desktop computers, laptop computers, workstations, terminals, servers, clients, portable computers, handheld computers, cell phones, mobile phones, smart phones, tablet computers, server farms, hardware appliances, minicomputers, mainframe computers, video game consoles, handheld video game products, and wearable computing devices including but not limited to eyewear, wristwear, pendants, fabrics, and clip-on devices. A "computer" is necessarily an abstraction of the functionality provided by a single computer device outfitted with the hardware and accessories typical of computers in a particular role. By way of example and not limitation, the term "computer" in reference to a laptop computer would be understood by one of ordinary skill in the art to include the functionality provided by pointer-based input devices, such as a mouse or track pad, whereas the term "computer" used in reference to an enterprise-class server would be understood by one of ordinary skill in the art to include the functionality provided by redundant systems, such as RAID drives and dual power supplies. It is also well known to those of ordinary skill in the art that the functionality of a single computer may be distributed across a number of individual machines. This distribution may be functional, as where specific machines perform specific tasks; or balanced, as where each machine is capable of performing most or all functions of any other machine and is assigned tasks based on its available resources at a point in time. Thus, the term "computer" as used herein can refer to a single, standalone, self-contained device or to a plurality of machines working together or independently as a logical computer, including without limitation: a network server farm, "cloud" computing system, software-as-a-service, or other distributed or collaborative computer networks. Those of ordinary skill in the art also appreciate that some devices which are not conventionally thought of as "computers" nevertheless exhibit the characteristics of a "computer" in certain contexts. Where such a device is performing the functions of a "computer" as described herein, the term "computer" includes such devices to that extent. Devices of this type may include but are not limited to: network hardware, print servers, file servers, NAS and SAN, load balancers, and any other hardware capable of interacting with the systems and methods described herein in the matter of a conventional "computer."

As used herein, the term "database" means a computer-accessible, organized collection of data. Databases have been used for decades to format, store, access, organize, and search data. Traditionally, databases were stored on a single storage medium controlled by a single computer processor, such as a fixed disk or disk array. However, databases may also be organized in a "distributed" fashion, wherein the database is stored on a plurality of storage devices, not all of which are necessarily operated by a common processor. Instead, distributed databases may be stored in multiple component parts, in whole or part, dispersed across a network of interconnected computers.

As used herein, "difficulty" means proof-of-work mining, or the expected total computational effort necessary to verify the next block in a blockchain. Difficulty is generally determined by the verification rules of the blockchain and may be adjusted over time to cause the blockchain to grow (e.g., new blocks to be verified and added) at a desired rate. For example, in the Bitcoin™ blockchain network, the difficulty adjusts to maintain a block verification time of about ten minutes across the blockchain network.

As used herein, the term "digital signature" means a mathematically-based system for demonstrating the authenticity of a message or document by ensuring that it was sent from the identified sender and not tampered with by an intermediary. Blockchains generally use asymmetric key encryption to implement digital signatures.

As used herein, the term "fork" means a split in a blockchain where two different valid successor blocks have been mined and are present in the blockchain, but consensus has not yet been reached as to which fork is correct. This type of fork is also referred to as a "soft fork," and is automatically resolved by consensus over time. A "hard fork" is the forced imposition of a fork by manual intervention to invalidate prior blocks/transactions, typically via a change to the blockchain rules and protocol.

As used herein, the term "genesis block" means the very first block in a blockchain.

As used herein, the term "hash" means a cryptographic algorithm to produce a unique or effectively unique value, properly known as a "digest" but sometimes also informally referred to as a "hash," usually from an arbitrary, variable-sized input. Hashes are repeatable and unidirectional, meaning the algorithm always produces the same digest from the same input, but the original input cannot be determined from the digest. A change to even one byte of the input generally results in a very different digest, obscuring the relationship between the original content and the digest. SHA256 (secure hash algorithm) is an example of a widely used hash.

As used herein, the term "ledger" means the append-only records stored in a blockchain. The records are immutable and may hold any type of information, including financial records and software instructions.

As used herein, the term "media" means one or more volatile and/or non-volatile computer readable medium. The medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

As used herein, the term "mining" means the process by which new transactions to add to the blockchain are verified by solving a cryptographic puzzle. In a proof-of-work blockchain network, mining involves collecting transactions reported to the blockchain network into a "block," adding a nonce to the block, then hashing the block. If the resulting digest complies with the verification condition for the blockchain system (i.e., difficulty), then the block is a valid next block in the blockchain.

As used herein, the term "network" generally refers to a voice, data, or other telecommunications network over which computers communicate with each other. The term "server" generally refers to a computer providing a service over a network, and a "client" generally refers to a computer accessing or using a service provided by a server over a network. Those having ordinary skill in the art will appreciate that the terms "server" and "client" may refer to hardware, software, and/or a combination of hardware and software, depending on context. Those having ordinary skill in the art will further appreciate that the terms "server" and "client" may refer to endpoints of a network communication or network connection, including but not necessarily limited to a network socket connection. Those having ordinary skill in the art will further appreciate that a "server" may comprise a plurality of software and/or hardware servers delivering a service or set of services. Those having ordinary skill in the art will further appreciate that the term "host" may, in noun form, refer to an endpoint of a network communication or network (e.g., "a remote host"), or may, in verb form, refer to a server providing a service over a network ("hosts a website"), or an access point for a service over a network. It should be noted that the term "blockchain network" as used herein usually refers to a subset of the Internet network.

As used herein, the term "node" means each copy of the ledger in the blockchain network.

As used herein, "nonce" means an arbitrary number or other data used once and only once in a cryptographic operation. A nonce is often, but not necessarily, a random or pseudo-random number.

As used herein, "proof-of-stake" means a mining system in which the production and verification of a block is pseudo-randomly awarded to a candidate miner, or prioritized list of candidate miners, who have invested a valuable stake in the system which can be collected by the blockchain network if the produced block is later deemed invalid. The stake functions as a deterrent against fraudulent blocks.

As used herein, "proof-of-work" means a mining system in which the difficulty of finding a nonce that solves the cryptographic puzzle is high enough that the existence of a block compliant with the verification rules is itself sufficient proof that the block is not fraudulent.

As used herein, "smart contracts" means computer programs executed by a computer system that facilitate, verify, or enforce the negotiation and performance of an agreement using computer language rather than legal terminology.

Smart contracts may be verified and executed on virtual computer systems distributed across a blockchain.

As used herein, the term "software" refers to code objects, program logic, command structures, data structures and definitions, source code, executable and/or binary files, machine code, object code, compiled libraries, implementations, algorithms, libraries, or any instruction or set of instructions capable of being executed by a computer processor, or capable of being converted into a form capable of being executed by a computer processor, including without limitation virtual processors, or by the use of run-time environments, virtual machines, and/or interpreters. Those of ordinary skill in the art recognize that software can be wired or embedded into hardware, including without limitation onto a microchip, and still be considered "software" within the meaning of this disclosure. For purposes of this disclosure, software includes without limitation: instructions stored or storable in RAM, ROM, flash memory BIOS, CMOS, mother and daughter board circuitry, hardware controllers. USB controllers or hosts, peripheral devices and controllers, video cards, audio controllers, network cards, Bluetooth® and other wireless communication devices, virtual memory, storage devices and associated controllers, firmware, and device drivers. The systems and methods described here are contemplated to use computers and computer software typically stored in a computer- or machine-readable storage medium or memory. Program code embodied on a computer readable medium may be transmitted using any appropriate medium, including but not limited to wireless, wireline, optical fiber cable, RF, etc., or any suitable combination of the foregoing.

As used herein, the term "transaction" means an asset transfer onto, off of, or within the ledger represented by the blockchain, or a logically equivalent addition to or deletion from the ledger.

As used herein, the term "transaction fee" means a fee imposed on some transactions in a blockchain network. The amount of the transaction fee typically is awarded to the miner who successfully mines the next block containing that transaction.

As used herein, the term "wallet" means a computer file or software of a user that allows a user of a blockchain network to store and spend cryptocurrency by submitting transactions to the blockchain network. A wallet is usually itself protected cryptographically via a private key.

As used herein, the terms "web," "web site," "web server," "web client," and "web browser" refer generally to computers programmed to communicate over a network using the HyperText Transfer Protocol ("HTTP"), and/or similar and/or related protocols including but not limited to HTTP Secure ("HTTPS") and Secure Hypertext Transfer Protocol ("SHTP"). A "web server" is a computer receiving and responding to HTTP requests, and a "web client" is a computer having a user agent sending and receiving responses to HTTP requests. The user agent is generally web browser software.

It will be understood by one of ordinary skill in the art that common parlance in the computing industry refers to a "user" accessing a "site." This usage is intended to represent technical access to an online server by a user via a user computer. That is, the reference to a "user" accessing a "server" refers to the user manipulating or otherwise causing client software to communicate over a telecommunications network with server software. This also typically means that the user's client software is running on a client computer system and accessing the server computer system remotely. Although it is possible that a user may directly access and use the server via the server hardware, and without use of a client system, this is not the typical use case in a client/server architecture.

Blockchain technology is essentially a particular type of distributed database. Blockchains can theoretically be used to store any type of data, but are particularly well-suited to environments in which transparency, anonymity, security, and verifiability are important considerations. Common examples include financial projects, such as cryptocurrencies, as well as auctions, capital management, barter economies, insurance lotteries, and equity crowd sourcing. As will be understood by a person of ordinary skill in the art, in distributed ledgers, a large number of unrelated participants in a network each maintain independent copies of the same ledger. When any given node in the blockchain network enters a transaction, that node updates its own ledger and transmits the details of the transaction to the other nodes, which update their copies of the ledger accordingly.

Blockchain networks have a "double-spend" attack risk, which is mitigated through the use of computational consensus. That is, in the event that verified transactions among the different copies of the ledger get out of synch, such as due to a deliberate attempt to defraud by spending the same asset multiple times, the attack can be detected and eliminated in the blockchain validation process. Blockchains comprise a series of blocks of data containing verified transactions. A cryptographic puzzle must be solved to "discover" a next valid block in the chain. In the event that multiple valid blocks are simultaneously discovered, a "fork" is created, only one branch of which will ultimately be valid. Whichever fork "discovers" its next block valid first becomes the correct, valid chain, and all other forks are discarded as invalid. Thus, over time, a computational consensus is reached among the nodes as to which transactions have been validated, and which transactions have not. This type of consensus is known as proof of work, but other consensus models and other distributed ledger models than blockchain are possible. For purposes of the present disclosure, any distributed ledger technology is suitable for use with the systems described herein.

Figure 2:
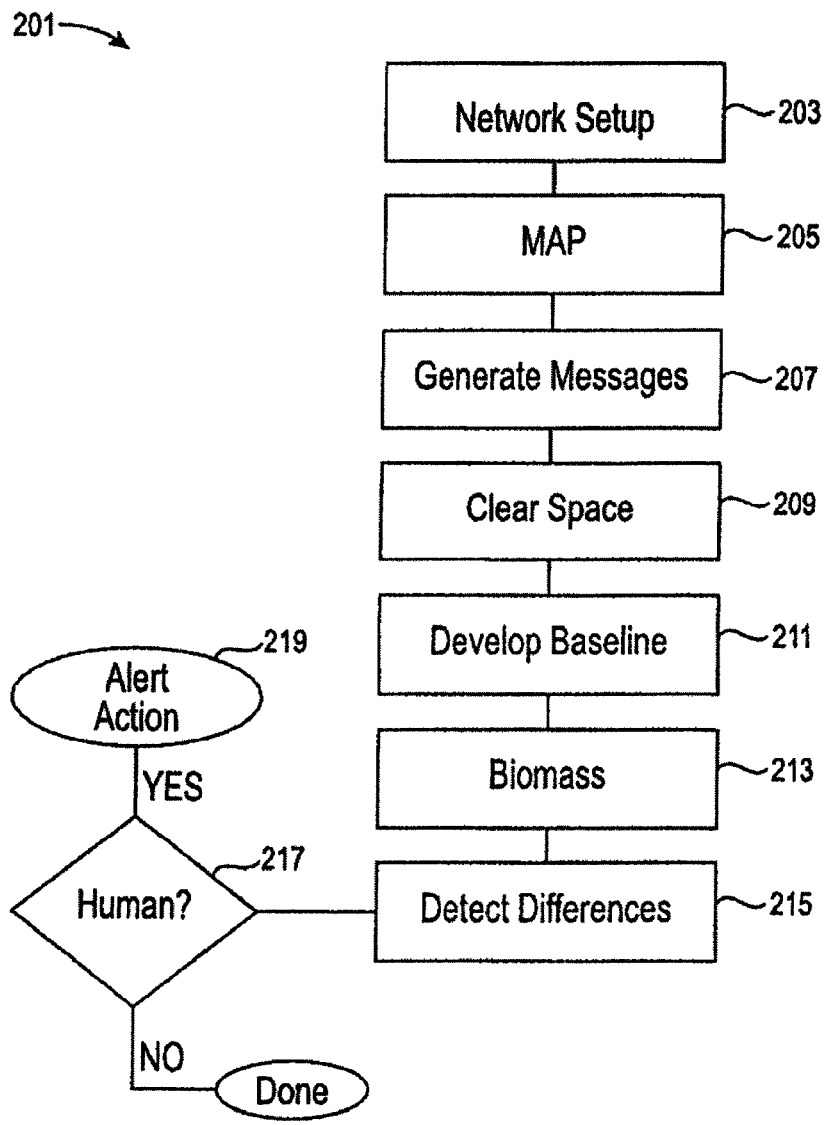
FIG. 2 is a flow chart of an embodiment of a prior art method for network presence sensing.
Figure 3A:
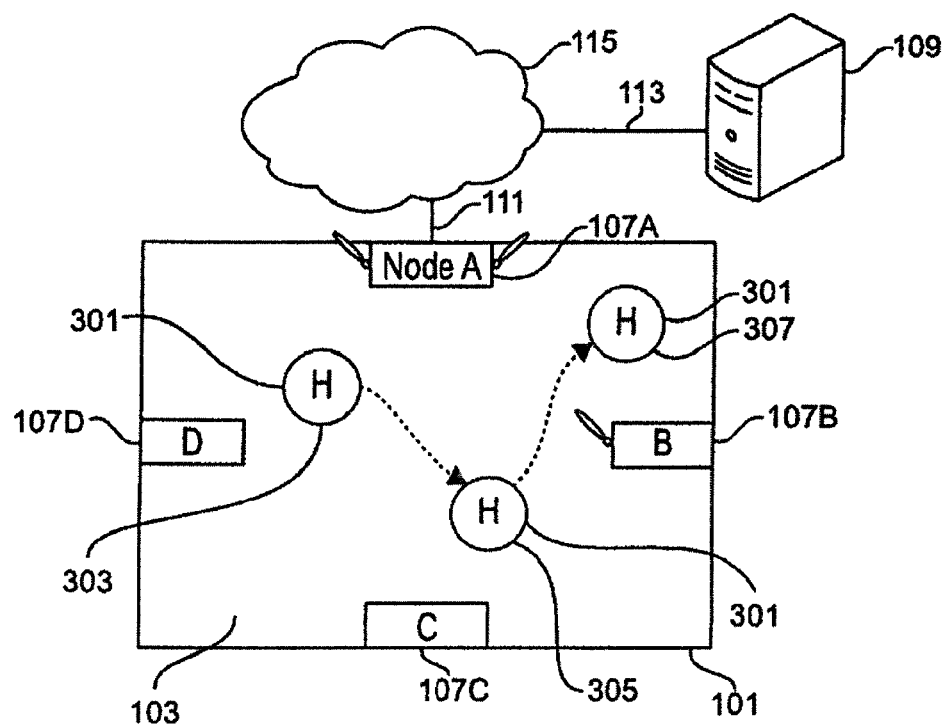
FIG. 3A depicts a schematic diagram of a prior art system for change detection in a detection network over time.
Figure 3B:
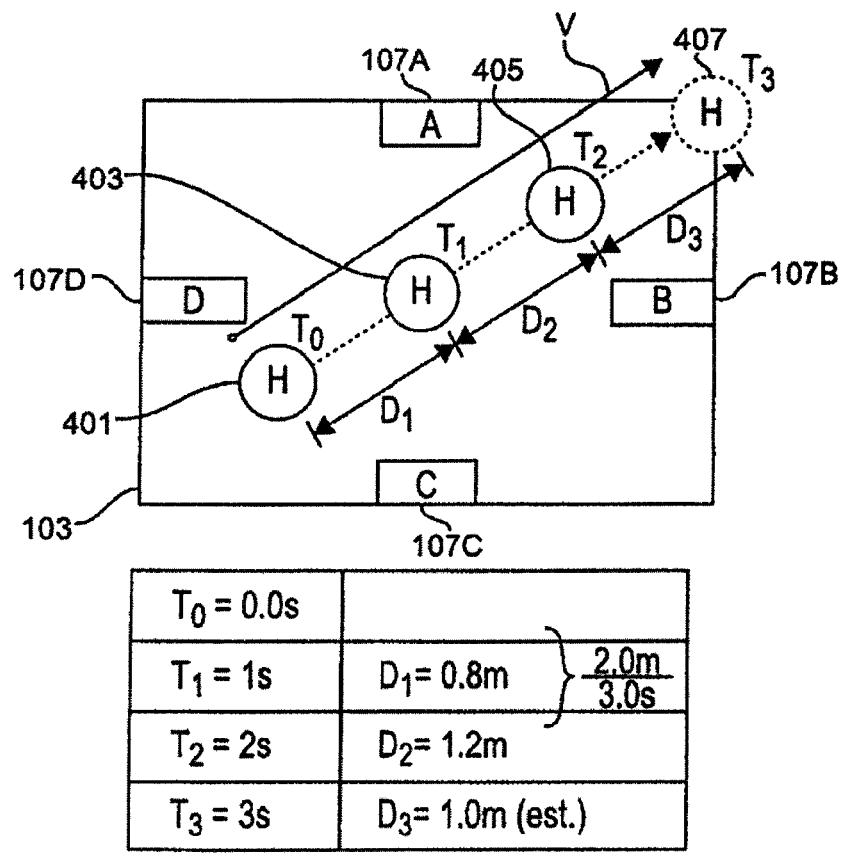
FIG. 3B depicts a schematic diagram of a prior art system for detecting changes in locations of humans in a detection network over time.

This application should be understood with respect to the systems and methods for detecting the presence of a human within a detection network, or "Network Presence Sensing" (NPS) described in U.S. Utility patent application Ser. No. 15/674,328, filed Aug. 10, 2017, U.S. Utility patent application Ser. No. 15/600,380, filed May 19, 2017, Utility U.S. Pat. No. 9,693,195, Utility U.S. Pat. No. 9,474,042, U.S. Provisional Patent Application No. 62/252,954, filed Nov. 9, 2015, and U.S. Provisional Patent Application No. 62/219, 457, filed Sep. 16, 2015. The disclosures of all of these documents are incorporated herein by reference. Various aspects of these disclosures are discussed herein, including NPS, which is, at a high level, the inference of the presence of humans within a detection network based on changes in the characteristics of wireless network signals caused by the absorption of wireless waves by the water mass of the human body within the detection network. FIG. 1 is a schematic diagram of a system and method for NPS according to the above references. FIG. 2 depicts an embodiment (201) of a method for NPS according to the above references. FIGS. 3A and 3B depict embodiments of NPS using change detection according to the above references.

Distributed ledger technologies can be used to confirm certain facts or circumstances concerning transactions and provide a contemporaneous record of same. Additionally, elements of distributed ledger technology may be utilized to record information based on changes and physical environments, more strongly tying digital and physical worlds together. In this way, industries such as data security, big data, and entertainment, can better leverage the distributed ledger technology.

At a high level of abstraction, the systems and methods described herein comprise confirming the presence of one or more individuals at a specific location at the time of a transaction, and to contemporaneously record information concerning the transaction in a distributed ledger. This may also include providing a signature on the ledger, such as by using a private key of one or more of the parties to the transaction. In an embodiment, the presence of individual(s) can be determined using network presence sensing (NPS), other types of sensors, or the combination of NPS with other sensors. Generally, the NPS network is an established wireless network disposed at a particular location, such as a residence, business, or public space. A person seeking to tender a transaction enters the geographic range of the NPS network carrying a mobile device. The presence of the mobile device and/or the individual may be detected by the NPS network, and communications may commence between the carried mobile device and the hardware forming the NPS network to negotiate a transaction. Additional sensors may be part of, or otherwise available to, the NPS network. The presence of the individual, the mobile device, and/or other sensor data, may be used to create a transaction entry in a blockchain showing the tender, and the accepting or declining of the tender, in the distributed ledger.

Additionally, the other data, such as the presence data and other sensor data, may be stored or otherwise associated with these transactional entries. The entries may be posted by one or more parties to the transaction, providing a secure and unfalsifiable record of the sensor data acquired at the moment in time that the transaction is posted. In this way, all parties to a transaction have access to a highly trustworthy, contemporaneous record of the circumstances surrounding the accepting or declining of the transaction. These systems and methods are described herein generally from the point of view of the owner or operator of an NPS system, which considers the device or devices constituting the network to be trusted devices. However, the same principles apply to all sides of the transaction.

Figure 4A:
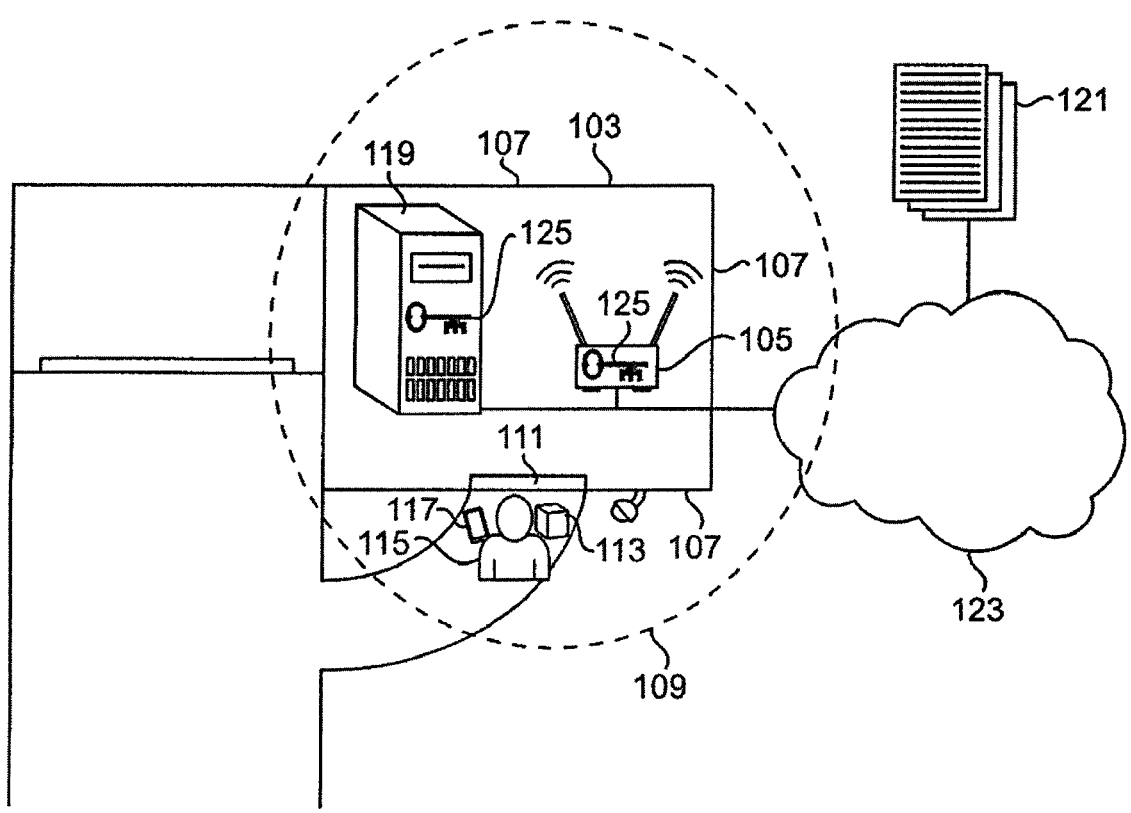
FIG. 4A depicts an embodiment of a system for verifiably processing a transaction using network presence sensing and a distributed ledger.
Figure 4B:
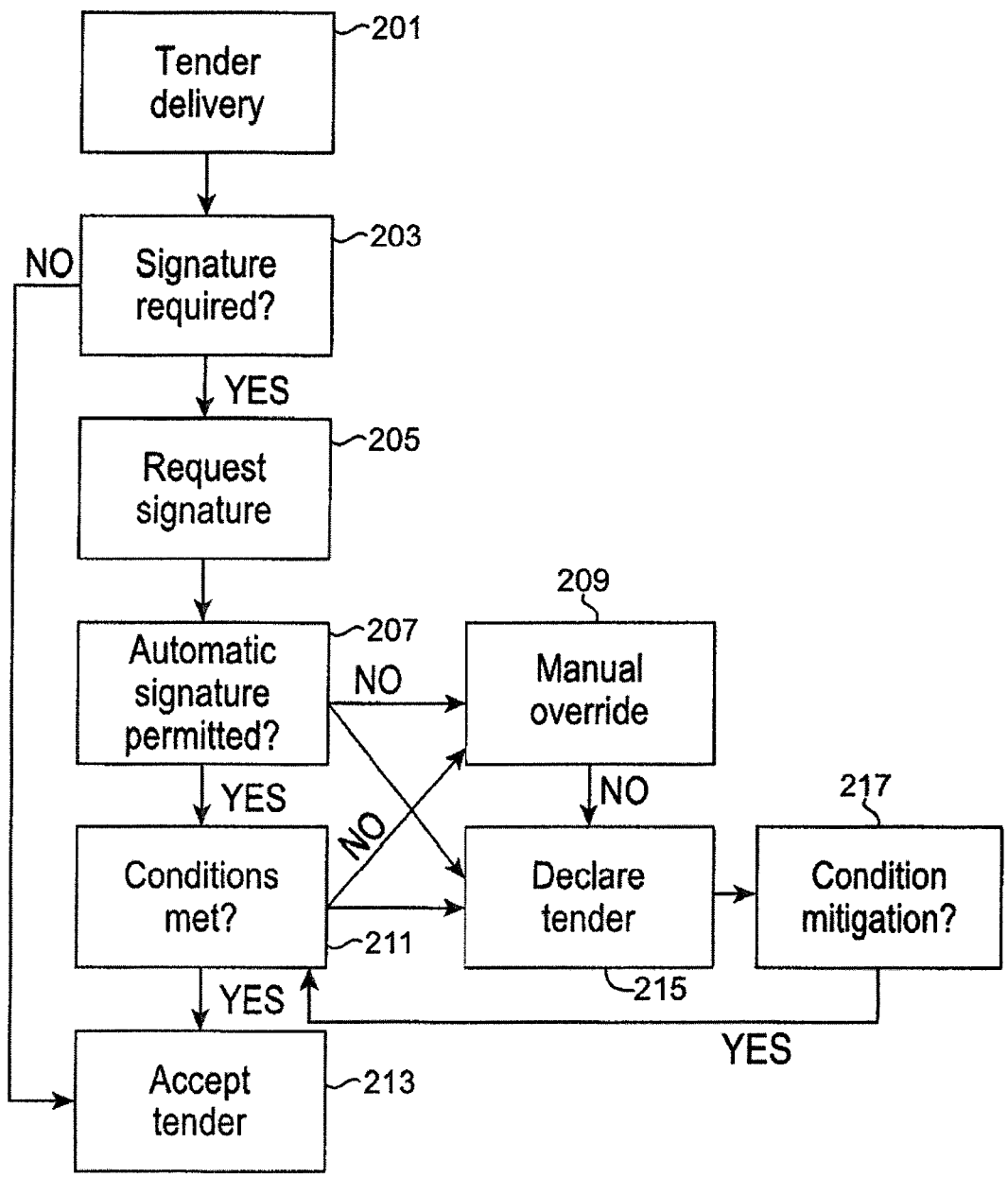
FIG. 4B depicts an embodiment of a method for verifiably processing a transaction using network presence sensing and a distributed ledger.

The present systems and methods may be better understood through use of a non-limiting, illustrative example. In this illustrative example, depicted in FIGS. 4A and 4B, present systems and methods are used in connection with confirming mail or package delivery. As is familiar to anybody, conventional delivery services, such as postal and common carriers, generally operate during normal business hours. If delivery requires a signature or other special handling but the recipient is not available, the carrier generally must reschedule delivery, or the recipient must schedule a pick-up time at a distribution center. This results in an inefficient use of resources for both the carrier and recipient.

However, many recipients are comfortable with packages or letters being delivered and left unattended at the delivery location, such as on a front porch or in a mailbox, secured container, or other designated location. To many, the important aspect of the delivery is receiving confirmation that the package has in fact been timely delivered to the correct location.

In the depicted embodiment of FIGS. 4A and 4B, an embodiment of the systems and methods described herein is depicted. In the depicted embodiment, a delivery location (107) is shown, having disposed therein a wireless network (109) formed at least in part by a wireless network device (105) disposed within the delivery location (107). In the depicted embodiment, the delivery location (107) is a private residence, but it will be understood by a person of ordinary skill in the art that the delivery location may be any location where a package may be delivered or a service may be provided, including, but not necessarily limited to, a business or commercial location, or a non-private location such as a park or government building. The depicted wireless network (109) implements NPS as described in the above-referenced patents and patent applications. Although only a single wireless network device (105) is shown in the depicted embodiment, it will be understood by a person of ordinary skill in the art, particularly in view of the disclosures of the above-referenced patents and patent applications, that in a typical implementation of NPS, a plurality of devices are utilized. A single device is depicted in the figures for sake of simplicity.

As can be seen in the depicted embodiment of FIG. 1A, the wireless network (109) is also connected to the public Internet (123). Through this connection, the depicted wireless network device (105) also participates as a node on a distributed ledger (121), such as a blockchain. In this capacity, the wireless network device (105) has a private key (125) generated through asymmetric cryptography that it uses to sign for transactions posted to the distributed ledger (121) on behalf of the NPS network (109). Additionally, and/or alternatively, the server (119) may perform some or all of the functions described herein as being performed by the wireless network device (105). As will be clear from the disclosures of the above-referenced patents, an off-the-shelf wireless networking device (105) may be used with NPS in conjunction with a server (119), or a special-purpose wireless network device (105) may be developed and used. Regardless of the division of labor between or among the components of the network, the resulting functions are essentially similar.

Most delivery locations (103) have at least one or more wireless network devices (105) located therein. In addition to the NPS functionality, the wireless network device (105) and/or a computer server (119) have software implementing the systems and methods described herein. The broadcast range of the wireless network (109) generally extends at least some distance beyond any physical or political barriers (107) of the location (103) in question. Thus, a carrier (115) approaching the location (103) to tender delivery of a package (113) usually is within range (109) of at least one of the wireless network devices (105) within the delivery location (103). When the mobile device (117) is within range (109), the presence of the mobile device (117) is detectable by, and able to communicate with, the wireless network device (105). The carrier (115) may connect the mobile device (117) to the wireless network device (105) and manipulate software on the mobile device (117) to conduct the steps and operations described herein. This facilitates the use of the wireless network device (105) to negotiate, and accept or decline, the tender of delivery.

In the depicted embodiment of FIGS. 4A and 4B, a carrier (115) having a mobile device (117) approaches a delivery location (103) with a package (113). The package (113) may be a deliverable parcel, including but not limited to letters or goods, and/or may comprise the performance of services. Accordingly, the term "package" as used in this illustrative example should be understood as encompassing services. For example, a mower could use the present system and methods to confirm performance ("delivery") of the mowing services.

First, the carrier (115) tenders delivery (201). This is done in the depicted embodiment by the carrier (115) manipulating an interface of the mobile device (117) to communicate with the wireless network device (105) and/or server (119), as appropriate to the particular embodiment, that the carrier (115) is present at the delivery location (103) and prepared to tender delivery. This may be done by direct communication between the mobile device (117) and the wireless network device (105). This embodiment is depicted in step 201 as shown in FIG. 1C. Alternatively, the tender of delivery may instead be posted to the distributed ledger (121) by the mobile device (117). As will be understood by a person of ordinary skill in the art, the tender of delivery is a transaction signed using a private key (125) of the carrier (115) or mobile device (117), and the associated public key is available so that the wireless network device (105) and/or server (119) can confirm the authenticity of the tender (201). If the signature is not confirmed to be acceptable, delivery is declined (215). A message may be communicated to the mobile device (117) indicating that the delivery was declined.

In the case where delivery is accepted (213), the carrier (115) can confirm and validate the signature and acceptance by examining the posted transaction on the blockchain (121) using the mobile device (117) as a node. Because the public key corresponding to the private key (125) of the recipient is available to the mobile device (117), it is possible to authenticate that the sender of the acceptance message is the wireless network device (105) acting on behalf of the recipient. The delivery carrier (115) thus may complete the delivery with confidence that the tender (201) was properly accepted (213). Again, the use of the asymmetric cryptography provides an extremely high level of confidence that the origin of the acceptance message is the recipient, inhibiting fraud. Next, in the depicted embodiment, the determination is made as to whether a signature is required for the delivery (203). This determination is primarily a function of the nature of the delivery, and often depends upon whether the sender requested a signed delivery. If delivery requires a signature (203), a digital signature may be requested (205) to accept the tender. In the depicted embodiment, the signature may be requested as a separate transaction from the tender of delivery, or may be a part of the same transaction request. Again, this may be the direct communication with the wireless network device (105) as shown in step 201 of FIG. 4C, or may be two separate steps as shown in FIG. 4B. Alternatively, this may also be done via one or more distributed ledger (121) transactions signed by the private key (125) of the carrier (115), as described elsewhere herein.

If no signature is required for delivery, then the tender is deemed accepted (213) and the delivery is complete, as would be the case in a conventional, ordinary package delivery. However, if a signature is required (203), the method proceeds to the next step. If the wireless network device (105) is configured to accept delivery (207), it (105) may proceed to make an automatic signing decision (211). This may be done with reference to previously configuration and settings data and/or other information, such as that provided by sensors, to make a signing decision (211). If the signature is confirmed to be acceptable according to the program logic, user settings, and other available conditional data (211), the wireless network device (105) automatically provides the signature (213) and accepts delivery. In the depicted embodiment, this is done by the wireless network device (105) posting a transaction to the distributed ledger (121), which is encrypted using the private key (125) associated with the recipient of the package (113). This embodiment is depicted in steps (211) and (213) of FIG. 4C. This posting may additionally, and optionally, include other contextual information, notably information acquired from the above-referenced sensors.

Additionally, in the event of a declined tender (215), the wireless network device (105) may indicate the reasons why delivery is declined. This facilitates mitigating actions that could be taken to allow acceptance. For example, if the carrier (115) fails to deposit the package (113) in a specific location, the wireless network device (105) may refuse delivery (215) but prompt the carrier to deposit the package (115) in a particular location. When a sensor detects the package (113) as being properly deposited (i.e., successful mitigation (217)), delivery is accepted (213) as described herein. This may be useful, for example, in a library depository or a bank drop box.

As described, the request for signature (205) may be submitted as part of a requested transaction in a distributed ledger (121). The signature also may be made via the distributed ledger (121). For example, after the wireless network device (105) receives a request for signature (205), if the decision to accept is made (213), the wireless network device (105) may use a locally stored private key (125) to digitally sign the transaction posted in the distributed ledger (121). The mobile device (117), also being a node on the distributed ledger (121), can then consult the blockchain (121) to confirm the authenticity signature using the corresponding public key of the wireless network device (105).

In this way, fraudulent signings may be inhibited, as the computational probability of a successfully forged private key (125) is effectively zero. Because the signature is encrypted using the private key (125) and recorded on the distributed ledger (121) and eventually becomes a permanent, validated transaction on the distributed ledger (121), the signature is effectively unalterable, unfalsifiable, and/or destroyable by any party. This also effectively allows a signature to be provided automatically only when certain conditions are met. In this way, delivery becomes more transparent and secure without impacting the overall delivery process for the carrier.

In an embodiment, the signature decision (211) may be made with reference to one or more conditions and/or data points. These conditions may be established in advance by the recipient user by way of configuration or settings data, or may be determined automatically, in connection with user input, and/or based on feedback from connected sensors (127). For example, the wireless network device (105) may have access to current local weather data via the Internet (123), and/or a connected sensor (127). If the wireless network device (105) has data indicating that current weather conditions are not appropriate for an unattended package (113), such as precipitation, then the wireless network device (105) may automatically decline (215). Similarly, the wireless network device (105) may decline (215) if the weather forecast calls for rain, even if current conditions are satisfactory.

However, mitigation (217) may be available. For example, if the carrier (115) deposits the package (113) in a specific location where the weather cannot damage it, delivery would be accepted (213). By way of example and not limitation, the specific location may be a container or a structure, such as a screened-in porch, garage, shed, or the interior of the dwelling.

Examples of additional sensor data that may be used to supplement, complement, or augment the detection capabilities include optical and audio sensors, as well as home automation systems, which can provide records for the opening/closing and or locking/unlocking of doors, such as ingress and egress doors, cargo and shipping doors, garage doors, or the disabling/enabling of security systems. For example, if a motion sensor is enabled, but detects no motion, this data can be used to confirm that there was nobody detected as present in the monitored room during the period of time that the motion sensor is enabled. By putting some or all of this information into a distributed ledger (121), it can be verified externally, and cannot be altered or falsified following creation. This assures the integrity of the information itself, and provides the parties to a disputed transaction a common set of data from which to resolve discrepancies.

Additionally, if conditions are imposed by the service provider or the recipient, sensor data may be used to verify these conditions are met before the job is started. For example, in the case where a service provider is scheduled to mow a yard, but does not mow on account of weather, weather data can be matched up with the date at which the service provider was scheduled to arrive at the location to perform the services to confirm that it was in fact raining at the time.

In an embodiment, the depicted systems and methods may include a manual intervention or override element (209). This generally comprises contacting the recipient to request acceptance when a condition is not satisfied. By way of example and not limitation, the wireless network device (105) may transmit a message to the owner/custodian on whose behalf the wireless network device (105) operates. The recipient may receive the request via software on a separate computer (not depicted) as would be familiar to a person of ordinary skill. The recipient may then indicate via the interface that delivery is accepted or declined. The wireless network device (105) may then accept or decline delivery as described herein.

By way of example and not limitation, in the event that the weather is forecasted to be inclement, and delivery is therefore declined, the recipient may be contacted and presented with the option to waive this condition, thus allowing the delivery to proceed. The recipient may make this decision, for example, if the recipient does not believe the weather forecast to be accurate, or the nature of the goods being delivered does not require good weather. Additionally, as can be seen in FIG. 4B, the manual override (209) step may be used where the wireless network device (105) is not configured to permit automatic signatures at all (207). In such circumstances, the default will be that a manual signature (209) is always requested. Additional information may be gathered and supplied to the recipient in connection with a manual override (209), such as, but not necessarily limited to, the configuration, settings, and other sensor data available to the wireless network device (105) at the time. It will be understood by a person of ordinary skill in the art that the carrier (115) may connect the mobile device (117) to the wireless network device (105), and manipulate software on the mobile device (117) to conduct the steps and operations described herein. This manner of using an application on a mobile device is by now familiar to a person of ordinary skill in the art and need not be further described herein.

In an embodiment, the concepts of the manual override step (209) and the mitigation step (217) may both be used in conjunction with one another. For example, the recipient may be contacted to provide instructions for mitigation of unexpected conditions that would permit acceptance of delivery. This may comprise simply requesting clarification on what the delivery carrier (115) must do to properly deliver the package, or, the recipient may remotely interact with other operating systems of the delivery location (103) remotely in order to facilitate delivery. By way of example and not limitation, the recipient may remotely unlock, open, or otherwise permit access to the delivery location (103) so that the package (113) may be deposited within. The wireless network device (105) may then sign for the delivery. Thus, if poor weather is forecasted, the recipient has the option of temporarily allowing access to the interior for purposes of delivery to facilitate signing (213). Other non-limiting examples of user overrides/mitigation include remotely viewing a security camera of the delivery location to confirm the identity of the carrier (115) or package (113).

In an embodiment, NPS may be used to confirm the presence and/or position or location of the carrier (115). This may include confirming that the carrier (115) entered and left the structure as expected. In the event of any anomaly, such as prolonged presence or no entry detected, delivery may be declined (215), and the distributed ledger (121) may reflect anomalies in the delivery attempt. By way of example, the transaction data posted to the blockchain (121) may indicate that the door was unlocked but NPS did not detect that the carrier (115) ever entered the location (103). Thus, if the recipient arrives home and finds that the package (113) is not present, there exists a contemporaneous record that the carrier (115) never entered the location (103), providing an evidentiary basis to contest the delivery. Similarly, in the circumstance where a carrier (115) goes to the wrong address to tender delivery, or fails to appear at the address to tender delivery at all, but nevertheless attempts to tender using the mobile device (117), NPS may be used to determine whether there is a human present at the delivery location (103). If the NPS determines that there is no human present, delivery may be declined due to this anomalous information, or the manual override (209) and/or mitigation (217) steps may be utilized to overcome this difficulty. This may help to facilitate proper delivery in a case where the carrier (115) is at the wrong address.

Figure 4C:
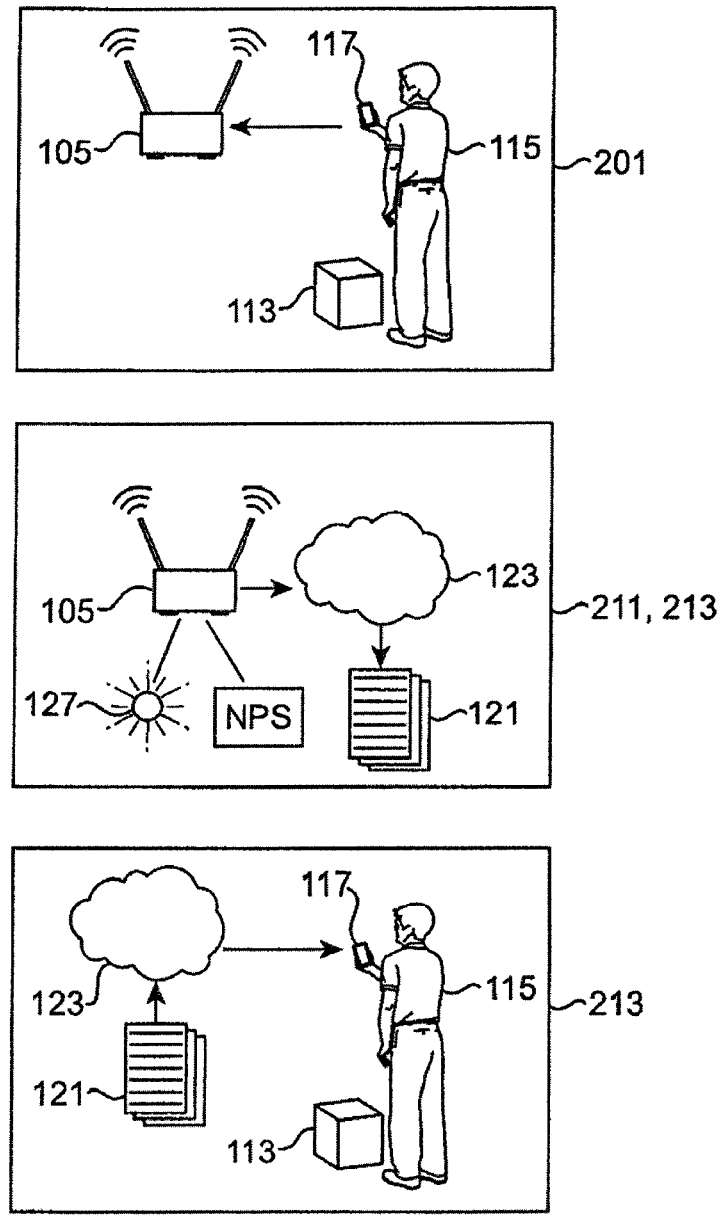
FIG. 4C depicts a schematic diagram of an alternative embodiment for verifiably processing a transaction using network presence sensing and a distributed ledger.

For all of the transactions contemplated in the illustrative embodiment of FIGS. 4A, 4B, and 4C, each step may optionally comprise additional data posted to the distributed ledger. As described elsewhere herein, this data is then generally encrypted using the private key of the posting entity (i.e., the carrier (115) or the wireless network device (105)), and the transaction data includes any relevant information documenting the circumstances or context surrounding the attempted delivery. The most reliable information will generally be automatically detected information from sensors, such as detecting presence of the carrier (115) using NPS, as well as other sensor data gathered. For example, temperature data, weather data, optical and auditory data, and the like may all be packaged or included with the transaction entry in the distributed ledger (121). The purpose of this information is to provide a contemporaneous record of the context of the transaction and to clearly document, through high-confidence signed entries on the distributed ledger (121), the conduct of each party. By posting to the distributed ledger (121), the information cannot be corrupted, modified, or falsified by either side of the transaction, allowing for a more easily traceable information flow concerning delivery, particularly when the recipient is not physically present.

Additional features may be possible through the use of tracking tags, such as RFID tags, which could track the package (113) posting data such as the time the tracking tag was removed from the package. Further, packages (113) often contain standard labels with scannable codes which when scanned, indicate to the carrier that the package (113) was delivered. In an embodiment, recording to the distributed ledger (121) in conjunction with such scans is possible, such as using a hand-held scanner carried by the carrier (115). These records may be matched with independent transactions from the wireless networking device (105). Discrepancies may then be more easily located to determine what was delivered, and when.

In an embodiment, recipients may supply delivery preferences in advance of delivery. These preferences may be made available or otherwise provided to the carrier (115) via the distributed ledger (121), allowing the carrier (115) to plan routes based upon the signatures most likely to be approved as indicated by publicly available preferences. For example, a subset of all recipients may refuse delivery on any given day based on weather conditions. If so, the carrier can skip those delivery locations (103) and tender delivery (201) only to those locations (103) where the settings indicate delivery is likely to be accepted (213). This reduces wasted time and effort in tendering deliveries (201) likely to be declined (215).

The use of other sensor inputs is possible including the use of digital and auditory sensors, such as cameras and microphones, as well as the use of weight plates and other sensors, such as to confirm that a package (113) has been physically deposited as expected. As noted elsewhere herein, home automation systems may be used to facilitate delivery and to maintain security by temporarily allowing interior access for delivery purposes.

Similarly, the systems and methods described herein may be used to verify the performance of services. This may be done, for example, by confirming the presence of a service provider mobile device (117) at the delivery location (103) for a length of time. This serves as evidence that the service provider (i.e., "carrier") (115) holding the mobile device (117) was present during the time that the services were purportedly performed. Following a similar process as that depicted in FIGS. 4A, 4B, and 4C, when a mobile device (117) carried by the provider (115) is present at the location (103), an identifier of the mobile device (117) may be detected and used to record information about the amount of time that the mobile device (117) is detectable, and its proximity to the location (103). For example, the media access control (MAC) address of the mobile device (117) may be used to uniquely identify the mobile device (117), and used to record and confirm the duration that a task was performed, such as a repair service, babysitting, lawn mowing, house painting, and so forth. Because typical Wi-Fi™ communications make MAC addresses available over the network, even if the mobile device (117) is not connected to the network, it is generally a usable unique identifier.

Abuse may be inhibited by also utilizing sensor information, such as by determining human presence with NPS. If the service provider (115) is aware of the mobile device (117) tracking, the service provider (115) may simply leave the mobile device (117) at the service location (103), but physically depart and not perform the services, while fraudulently billing for time not spent working. To mitigate this, NPS may be used to determine a presence or absence of a human within the location (103), or within a specific subarea thereof. Consequently, it is possible to confirm not only that the service provider's mobile device (117) was present at the time, but also that a human was present. This data may also be included in the distributed ledger (121), making it visible to both parties and allowing for the immediate detection of anomalies, such as a worker (115) walking off-site. This information could also be used for health and safety purposes, such as noting that a worker has unexpectedly stopped moving, and may be injured.

As with delivery, other sensors may be used to further supplement this information and provide more data about the services being performed and the context. This provides security, transparency, and certainty, and can show that the hours reported by the service provider (115) are accurate. The recipient then is not reliant solely on the accuracy of the service provider (115). Further, in an embodiment, the resulting distributed ledger (121) data may be used to generate invoices. This reduces fraud and error in estimating the amount of time spent on task. This will not only improve trust between service providers and recipients, but improve collection for service providers, who can confidently confirm the hours.

Additionally, this technology is applicable to shared economies. For example, in ride sharing, a driver may establish a wireless network for passengers to connect to while riding in the car. In this embodiment, the vehicle is the delivery location (103), and the driver is the "carrier" (115). A connection between a passenger's wireless device and a vehicle can be used to infer that the passenger is in the vehicle at the time that the passenger's device was detected by the vehicle. Such information could further be confirmed by other sensing systems, such as but not necessarily limited to an occupancy detection or sensing system of the vehicle. In an embodiment, one such occupancy detection or sensing system is NPS. A connection between a passenger devices, coupled with occupancy detection, and possibly also in connection with locational data for the vehicle and/or the passenger device, can be used to confirm that the passenger was indeed transported between a designated pickup and drop-off location. By storing this information in a digital ledger, both parties have access to tamper-resistant data which confirms both the existence of the contract and the performance of the services. This concept can also be applied to other shared economies. In an embodiment, this concept can be used in conjunction with confirming presence and use of a dwelling (e.g., short-term rentals) via access by renter devices to a WiFi network of the dwelling, also optionally in connection with occupancy sensing systems such as NPS at the property.

These systems and methods have a wide range of applications. By confirming the presence of the mobile device (117) in conjunction with the detection of the presence of a human (113) proximate to that device, two data points converged to provide with significant confidence that a particular person was present at a given moment in time. This may be used to confirm that, as indicated elsewhere herein, workers were actually performing work as expected. In addition to the above service provider example, these methods can be used to confirm that employees working from home are in fact at home as indicated, or that a contractor left a job site as indicated, or a plumber spent the majority of the time at an intended job site. By placing this information into a distributed ledger (121), it can be later verified externally against other records, and cannot be tampered with following creation. This assures the validity of the information and will lead to more trustworthy transactions.

Figure 5:
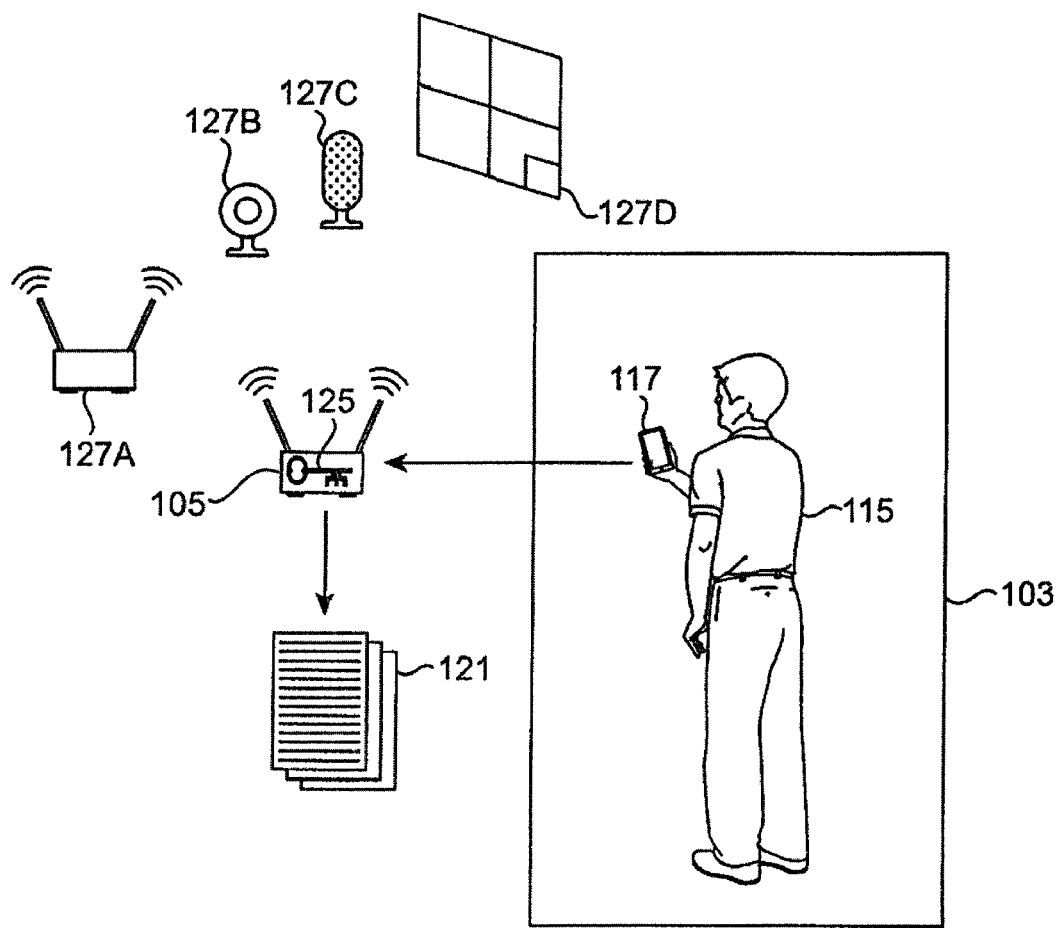
FIG. 5 depicts an embodiment of systems and methods for using a trusted device as a verified signature for information posted to a distributed ledger.

The present systems and methods may be used as a trusted device (e.g., functionally, router (105)) for a private key (125) at a known location where "signed" information may be posted, sensors and/or untrusted devices that provide information to the trusted device (105) to sign using its private key (125), and a local network may ensure that the trusted device (105) is in physical proximity to the sensors and/or untrusted devices (117). An exemplary embodiment is depicted in FIG. 5, in which the trusted device (105) may be a router (105) providing a local Wi-Fi™ network. In the depicted embodiment, sensors may include a second router (127A) that reports which devices are on its network, presence sensors, cameras (127B), auditory sensors (127C), windows/door sensors (127D), and so forth. Other sensors are possible. Untrusted devices may comprise guest computers, guest smartphones, and may send arbitrary data via the trusted device (105). The location (103) where information is posted may comprise: a trusted local location, a trusted remote location controlled by the same owner as the router, a remote location controlled by a trusted third party, or may use technologies such as a distributed ledger (121) to avoid the need for trust. If using a distributed ledger (121) for example, a full set of data may be stored directly on a distributed ledger (121), or another storage option.

For example, in an embodiment, an untrusted phone (117) may relay data via a router (105) implementing the systems and methods described herein. In the depicted embodiment, the untrusted phone (117) requests (e.g., via an application) that data it sends to the router (105) be encrypted by the router's private key (125) and sent to a desired location. This may be, for example, a field of a transaction on a distributed ledger (121). The original data may be extracted using a corresponding public key associated with the router's private key (125), which can demonstrate that the phone (117) must have passed the data through the router (105) for encryption using the router's corresponding private key (125). In this way, encrypted data may be recorded in a distributed ledger (121) to create an unalterable record of a transaction at a specific point and time and space. That is, it is then verifiable that the untrusted phone (117) was at the location (103) at the transaction time to pass data through the router (105) for encryption (117). Because the physical broadcast range of Wi-Fi™ routers are limited, it is known that the device (117) was within that range at the time that the transaction posted.

This further allows an untrusted device to demonstrate that it sent data from the location (103), which has many applications. Referring back to the delivery example in FIGS. 4A, 4B, and 4C above, the carrier (115) verifies that the package (113) was left at the appropriate location (103). Similarly, in an augmented reality game, it could confirmed that an individual was physically at a required location at a required time.

Generally, the router (105) is under the control of a trusted party, such that the location verification is also trustworthy. That is, the custodian of the router (105) is known to be trustworthy for confirming the physical location (103) of the router (105), which reduces the likelihood of a fraudulent location (103) being recorded by relocating the router (105). Again referring to the package delivery example, the trusted party would be the owner of the home (103) where a package (113) is to be delivered, and the router (105) is known to be in the home (103) because the person recording the transaction has no motivation to falsify it. Additionally, physically moving a router (105) from the home (103) to plug it in elsewhere, where there is also readily available open Internet access such that the router (105) could operate, is difficult and unlikely. If the router (105) custodian is not trusted, the connecting device may also include its own location-specific data, such as, but not limited to, GPS coordinates. In combination with a process for managing disagreements, this facilitates both the connecting device and the router (105) to be untrusted by each other.

In the augmented reality example, a developer of the game could distribute location verification hardware or use a trustworthy third-party system. Similarly, a network of institutions, such as libraries, schools, or government offices, could provide physical location certification services and publish a table mapping physical location to public keys. This database may then be accessed to confirm the location of data published to the ledger and encrypted via the public key.

A still further use of this technology is to limit the period of time during which a password is functional, such as for access to a network or computer. For example, a clock or other chronometer may be used to generate a Boolean state that is in turn used to select an encryption key. This selection may be at random or from a predefined list of keys. A plaintext password input by a user is then encrypted with the selected key to generate a full password. For example, if the system uses one key only during business hours, then a full password initially generated during business hours would only function during business hours; at any other time, the plain text password would be encrypted with an incorrect key and the full password would therefore be incorrect.

Other sensors may be used to implement this functionality in other contexts; for example, a sensor that was able to count the number of people in a room could be used to create a password that would only be valid when nobody else is nearby. By way of example, if a human occupancy sensing system (e.g., NPS) is coupled to a computer system which is intended to be accessed only by one person (e.g., with no other persons in physical proximity, such as onlookers or even another person trying to coerce an authorized user to access and use the system using the authorized user's credentials), then a password input into the terminal could be encrypted using a key generated by the human occupancy sensing system when only one person is detected. However, if more than one person is detected as present in the monitored region, the encryption key would be different, effectively preventing access.

This same logic could be applied if a system required any given number of people to be present for access, in that the key would only match in the event that the proper number of people are detected present. Such a system may validate that the authorized user is in fact authorized (via the password), and that the access occurs under authorized conditions (e.g., the number of people present) based on the encryption key from an external system. The external systems may select the appropriate key based on one or more pieces of information including, but not limited to: time of day, date, the balance of a cryptocurrency wallet, sensed devices, sensed human occupancy, sensed weather conditions, and others.

In another example use case, a fingerprint sensor may be used to identify individuals and select a key based upon the individual present. This would allow an individual present at the creation of the full original password to also be required to be present to access a password-protected item. Where there is more than one user, all of the fingerprints must be simultaneously present. As a variation, any numbered of desired variant full passwords can be generated which would also be accepted. In this example, this could be used to permit, for example, five people to make a set of original passwords that will allow any three of them in combination to access the password-protected content. This can further be made location specific by storing the private keys on a local machine, or can be made location agnostic dependent only upon the state of a set of sensors. For example, a network of terminals may all have private key databases synchronized, or private key stored on a secure server or by trusted computers, and can send the plain text password and sensor state over a secure communication and receive back the full password.

While the invention has been disclosed in conjunction with a description of certain embodiments, including those that are currently believed to be the preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

The invention claimed is:

1. A method for documenting the presence of a human and computing device at a particular place and time comprising:
    providing a first set of one or more sensors disposed at a location and adapted to detect the presence of a human at said location;
    providing a second set of one or more sensors disposed at said location and adapted to detect the presence of a computing device at said location;
    providing a distributed ledger adapted to record timestamped records;
    detecting, using said first set of one or more sensors, a human present at said location;
    detecting, using said second set of one or more sensors, a computing device at said location;
    posting to said distributed ledger a timestamped record indicating said detected presence of said human at said location and said detected presence of said computing device at said location
    wherein said posted timestamped record comprises data for confirming a transaction between a plurality of parties; and
    wherein said posted timestamped record is accessible to each party in said plurality of parties.

2. The method of claim 1, wherein said first set of one or more sensors comprises a network presence sensing system.

3. The method of claim 1, wherein at least one sensor in said first set of one or more sensors comprises a motion sensor.

4. The method of claim 3, wherein said motion sensor is selected from the group consisting of: a PIR sensor, an ultrasound sensor, and a hybrid system.

5. The method of claim 1, wherein at least one sensor in said first set of one or more sensors is selected from the group consisting of: a beam break sensor, a camera, and a weight plate.

6. The method of claim 1, wherein at least one sensor in said first set of one or more sensors is selected from the group consisting of: a transceiver, a camera, and a microphone.

7. The method of claim 6, wherein said at least one sensor comprises a transceiver adapted for wireless communicates using radio waves.

8. The method of claim 1, wherein said posted timestamped record includes additional information.

9. The method of claim 8, wherein said additional information is in a raw or a processed form.

10. The method of claim 8, wherein said additional information includes one or more of the group consisting of: video information; audio information; a state of an access point to said location; a security system status; a weight sensor status; current weather; predicted weather; photographs; and light sensor information.

11. The method of claim 1, where said transaction is selected from the group consisting of: a package delivery, reaching a geocached item, and an event in an augmented reality game.

12. The method of claim 11, wherein said transaction comprises a sequence of subtransactions over time.

13. The method of claim 12, further comprising:
    amending said posted timestamped record with data about each subtransaction in said sequence.

14. The method of claim 12, further comprising, for each subtransaction in said sequence:
    detecting at the time of said each subtransaction, using said first set of one or more sensors, a human present at said location;
    detecting at the time of said each subtransaction, using said second set of one or more sensors, a computing device at said location;
    posting to said distributed ledger a timestamped record of said detected presence of said human at said location at said time of said each subtransaction and said detected presence of said computing device at said location at said time of said each subtransaction.

15. The method of claim 12, wherein said transaction comprises tender of a service.

16. The method of claim 15, wherein said service is selected from the group consisting of: handyman work, lawn services, babysitting, transportation, ridesharing, working from home, and employee timekeeping.

17. The method of claim 1, wherein said posted timestamped record comprises asymmetrically encrypted data.

18. The method of claim 1, wherein said posted timestamped record further comprises real-world metrics.

19. The method of claim 18, further comprising:
    detecting the presence of one or more objects at said location at the time of said transaction; in said posting, said timestamped record including real-world metrics, about said detected one or more objects.

20. The method of claim 1, further comprising:
    determining whether at least one precondition to said transaction is met;
    wherein said posting step is performed only if, in said determining step, said at least one precondition is determined as being met.

21. The method of claim 20, wherein said determining further comprises determining whether said at least one precondition is met based on one or more of the group consisting of: current weather, predicted weather, temperature, time of day, and sensing one or more objects at a sublocation at said location.

22. The method of claim 21, further comprising:
    if said at least one precondition is determined not to be met in said determining step, modifying said at least one precondition such that said at least one precondition is met.

23. The method of claim 20, wherein said at least one precondition comprises a plurality of sets of subconditions; and
    said determining further comprises determining whether, said at least one precondition is met based on whether at least one of said sets of subconditions in said plurality of sets of subconditions is determined to be met.

24. The method of claim 20, wherein said at least one precondition comprises remotely providing a signature.

25. The method of claim 20, wherein said at least one precondition comprises remotely providing access to a sublocation at said location.

26. The method of claim 1, further comprising:
  detecting anomalies at said location at the time of said transaction;
  wherein said posted timestamped record further comprises an indication of said anomalies detected at said time.

27. The method of claim 1, wherein said confirmation data is used as a precondition to grant physical or electronic access to protected content.

28. The method of claim 1, where said confirmation data is used to generate an invoice.

29. The method of claim 28, wherein said posted timestamped record is used to generate said invoice.

* * * * *